US012593728B2

(12) United States Patent
Oose

(10) Patent No.: US 12,593,728 B2
(45) Date of Patent: Mar. 31, 2026

(54) SEMICONDUCTOR MODULE

(71) Applicant: FUJI ELECTRIC CO., LTD.,
Kanagawa (JP)

(72) Inventor: Tomofumi Oose, Shenzhen (CN)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 745 days.

(21) Appl. No.: 17/973,550

(22) Filed: Oct. 26, 2022

(65) Prior Publication Data

US 2023/0044711 A1     Feb. 9, 2023

Related U.S. Application Data

(63) Continuation of application No.
PCT/JP2021/035466, filed on Sep. 27, 2021.

(30) Foreign Application Priority Data

Nov. 25, 2020     (JP) ................................. 2020-195551

(51) Int. Cl.
*H01L 23/00*     (2006.01)
*H01L 25/065*     (2023.01)
(52) U.S. Cl.
CPC .............. *H01L 24/09* (2013.01); *H01L 24/08*
(2013.01); *H01L 24/48* (2013.01);
(Continued)
(58) Field of Classification Search
CPC ......... H01L 24/08; H01L 24/09; H01L 24/48;
H01L 25/0655
See application file for complete search history.

(56) References Cited

U.S. PATENT DOCUMENTS 5,559,374 A * 9/1996 Ohta ....................... H01L 24/49
257/723
11,942,449 B2 * 3/2024 Sauerland ........... H01L 23/3735
(Continued)

FOREIGN PATENT DOCUMENTS

CN         105551378 A     5/2016
CN         108807323 A     11/2018
(Continued)

OTHER PUBLICATIONS

Office Action issued for counterpart Japanese Application No.
2022-565090, transmitted from the Japanese Patent Office on Dec.
19, 2023 (drafted on Dec. 15, 2023).
(Continued)

*Primary Examiner* — Nathan W Ha

(57)          ABSTRACT

Provided is a semiconductor module including a main circuit
portion, a plurality of circuit electrodes, a plurality of main
terminals, and a plurality of wires, in each of semiconductor
chips, transistor portions and diode portions have a longi-
tudinal side in a second direction, each of semiconductor
chips has a plurality of end sides including a gate-side end
side, each of the gate-side end sides is arranged facing a
same side in a top view, the plurality of main terminals are
arranged on a same side in relation to the main circuit
portion so as not to sandwich the main circuit portion in a top
view, each of the plurality of wires has a bonding portion,
and a longitudinal direction of the bonding portion has an
angle in relation to the second direction.

22 Claims, 14 Drawing Sheets

(52) U.S. Cl.
CPC .. *H01L 25/0655* (2013.01); *H01L 2224/0801* (2013.01); *H01L 2224/08054* (2013.01); *H01L 2224/08056* (2013.01); *H01L 2224/0807* (2013.01); *H01L 2224/09152* (2013.01); *H01L 2224/09153* (2013.01); *H01L 2224/09155* (2013.01); *H01L 2224/48227* (2013.01); *H01L 2924/1203* (2013.01); *H01L 2924/13055* (2013.01)

(56) References Cited

U.S. PATENT DOCUMENTS

| | | | | |
|---|---|---|---|---|
| 12,040,263 | B2 * | 7/2024 | Tiziani | H01L 23/49575 |
| 2013/0062745 | A1 * | 3/2013 | Kimura | H01L 23/49575 |
| | | | | 257/E23.116 |
| 2014/0231926 | A1 | 8/2014 | Okumura | |
| 2014/0284784 | A1 * | 9/2014 | Yasunaga | H01L 23/52 |
| | | | | 257/690 |
| 2018/0090442 | A1 | 3/2018 | Li | |
| 2018/0315684 | A1 | 11/2018 | Sato | |
| 2019/0006258 | A1 * | 1/2019 | Muto | H01L 23/4006 |
| 2019/0287964 | A1 | 9/2019 | Yamano | |
| 2020/0144147 | A1 * | 5/2020 | Muto | H01L 23/49562 |
| 2020/0343240 | A1 | 10/2020 | Eguchi | |
| 2021/0217741 | A1 | 7/2021 | Ishimatsu | |
| 2022/0301966 | A1 * | 9/2022 | Kimura | H01L 23/4334 |

FOREIGN PATENT DOCUMENTS

| | | | |
|---|---|---|---|
| CN | 110100314 | A | 8/2019 |
| DE | 212018000195 | U1 | 12/2019 |
| JP | H09116090 | A | 5/1997 |
| JP | H09129805 | A | 5/1997 |
| JP | H1032218 | A | 2/1998 |
| JP | 2003188378 | A | 7/2003 |
| JP | 2020117233 | A | 8/2020 |
| JP | 2020181918 | A | 11/2020 |
| KR | 20120043453 | A | 5/2012 |
| WO | 2013046824 | A1 | 4/2013 |
| WO | 2018225571 | A1 | 12/2018 |
| WO | 2019244372 | A1 | 12/2019 |

OTHER PUBLICATIONS

International Search Report and (ISA/237) Written Opinion of the International Search Authority for International Patent Application No. PCT/JP2021/035466, mailed by the Japan Patent Office on Dec. 21, 2021.

Office Action issued for counterpart Chinese Application 202180030837.9, issued by The State Intellectual Property Office of People's Republic of China on Jul. 22, 2025.

* cited by examiner

26

107

SEMICONDUCTOR MODULE

The contents of the following Japanese patent application(s) are incorporated herein by reference:
NO. 2020-195551 filed in JP on Nov. 25, 2020
NO. PCT/JP2021/035466 filed in WO on Sep. 27, 2021

BACKGROUND

1. Technical Field

The present invention relates to a semiconductor module.

2. Related Art

Up to now, a semiconductor module in which a main electrode of a semiconductor chip and a circuit electrode are connected to each other by a wire has been known (for example, see Patent Document 1).
Patent Document 1: Japanese Patent Application Publication No. 2003-188378

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are essential to the solving means of the invention. Note that in the present specification and the drawings, elements having substantially a same function and configuration are assigned with a same reference sign to omit duplicated descriptions, and illustrations of elements that are not directly related to the present invention will be omitted. In addition, in a single drawing, with regard to elements having a same function and configuration, a representative element is assigned with a reference sign, and a reference sign to the others may be omitted.

As used herein, one side in a direction parallel to a depth direction of a semiconductor chip is referred to as "upper" and the other side is referred to as "lower". One surface of two principal surfaces of a substrate, a layer or other member is referred to as an upper surface, and the other surface is referred to as a lower surface. An "upper" or "lower" direction is not limited to the gravity direction or a direction when a semiconductor module is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis. In the present specification, orthogonal axes parallel to the upper surface and the lower surface of the semiconductor chip are set as an X axis and a Y axis. In addition, an axis perpendicular to the upper surface and the lower surface of the semiconductor chip is set as a Z axis. In the present specification, the direction of the Z axis may be referred to as the depth direction. Further, in the present specification, a direction parallel to the upper surface and the lower surface of the semiconductor chip may be referred to as a horizontal direction, including an X axis direction and a Y axis direction.

In the present specification, a case where a term such as "same" or "equal" is mentioned may include a case where an error due to a variation in manufacturing or the like is included. The error is, for example, 10% or less. In addition, when a difference of angles is 5 degrees or less, the angles are regarded as the same.

Figure 1:
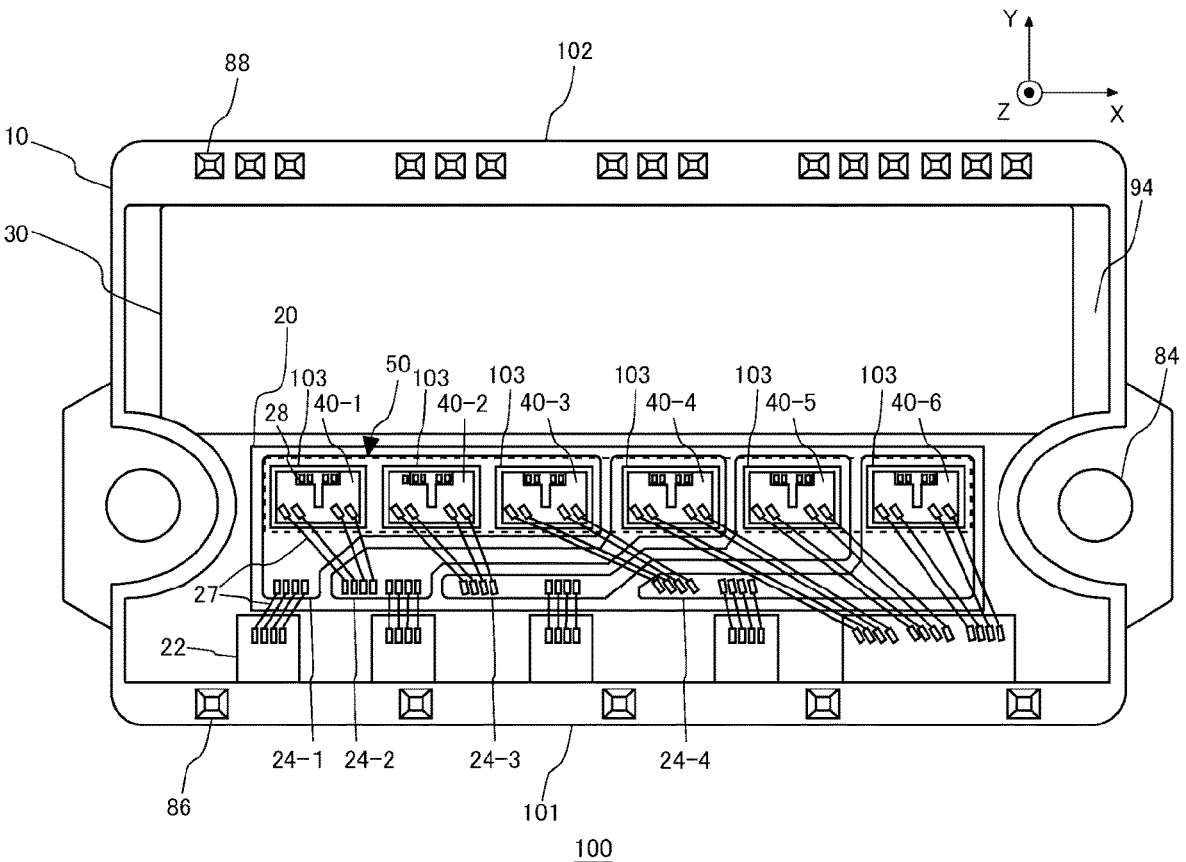
FIG. 1 illustrates an example of a semiconductor module 100 according to an embodiment of the present invention.

FIG. 1 illustrates an example of a semiconductor module 100 according to an embodiment of the present invention. The semiconductor module 100 may function as a power conversion apparatus such as an inverter or a converter. The semiconductor module 100 includes a resin casing 10, a main circuit insulated substrate 20, a plurality of main terminal circuit portions 22, a plurality of circuit electrodes 24, a plurality of wires 27, a control circuit portion 30, a main circuit portion 50, a plurality of main terminals 86, and a plurality of control terminals 88. The main circuit portion 50 is a region indicated by a dotted line in FIG. 1. In the present specification, orthogonal axes on a surface on which the main circuit insulated substrate 20 is provided are set as an X axis and a Y axis, and an axis perpendicular to an X-Y plane is set as a Z axis. FIG. 1 illustrates an arrangement example of respective members on the X-Y plane.

In the semiconductor module 100 of the present example, the plurality of circuit electrodes 24 and the main circuit portion 50 are arranged on the main circuit insulated substrate 20. In the example of FIG. 1, a circuit electrode 24-1, a circuit electrode 24-2, a circuit electrode 24-3, and a circuit electrode 24-4 are arranged on an upper surface of the main circuit insulated substrate 20. The circuit electrode 24 may be configured by directly bonding, or bonding via a brazing material layer, a copper plate or an aluminum plate, or a plate obtained by plating these materials to the main circuit insulated substrate 20 made of aluminum oxide ceramics, silicon nitride ceramics, aluminum nitride ceramics, or the like. In the main circuit insulated substrate 20, zirconium oxide, yttrium oxide, or the like may be added to the ceramics. In addition, the circuit electrode 24 may be an alloy including at least any one of copper or aluminum. Note that the main circuit insulated substrate 20 and the circuit electrode 24 may be obtained by affixing an insulating sheet to a conductive member such as a copper plate or an aluminum plate. That is, the main circuit insulated substrate 20 and the circuit electrode 24 may be a plate like member in which the conductive member and the insulating member are integrated with each other.

In the main circuit portion 50, the plurality of semiconductor chips 40 are arrayed and arranged along a first direction. In the present example, the first direction is the X axis direction. In FIG. 1, a semiconductor chip 40-1, a semiconductor chip 40-2, a semiconductor chip 40-3, a semiconductor chip 40-4, a semiconductor chip 40-5, and a semiconductor chip 40-6 are arrayed and arranged along the X axis direction. The semiconductor chip 40 is arranged on an upper surface of the circuit electrode 24. In the present example, the semiconductor chip 40-1, the semiconductor chip 40-2, and the semiconductor chip 40-3 are arranged on an upper surface of the circuit electrode 24-1. In addition, the semiconductor chip 40-4 is arranged on an upper surface of the circuit electrode 24-2. The semiconductor chip 40-5 is arranged on an upper surface of the circuit electrode 24-3. The semiconductor chip 40-6 is arranged on an upper surface of the circuit electrode 24-4. When the semiconductor chip 40 is arranged on the upper surface of the circuit electrode 24, a back surface electrode (not illustrated) of the semiconductor chip 40 may be connected with the upper surface of the circuit electrode 24. The back surface electrode of the semiconductor chip 40 is a collector electrode as an example. In the present example, the semiconductor chip 40 is a reverse conducting (RC)-IGBT in which an insulated gate bipolar transistor (IGBT) and a diode such as a free wheel diode (FWD) are combined with each other.

Figure 2:
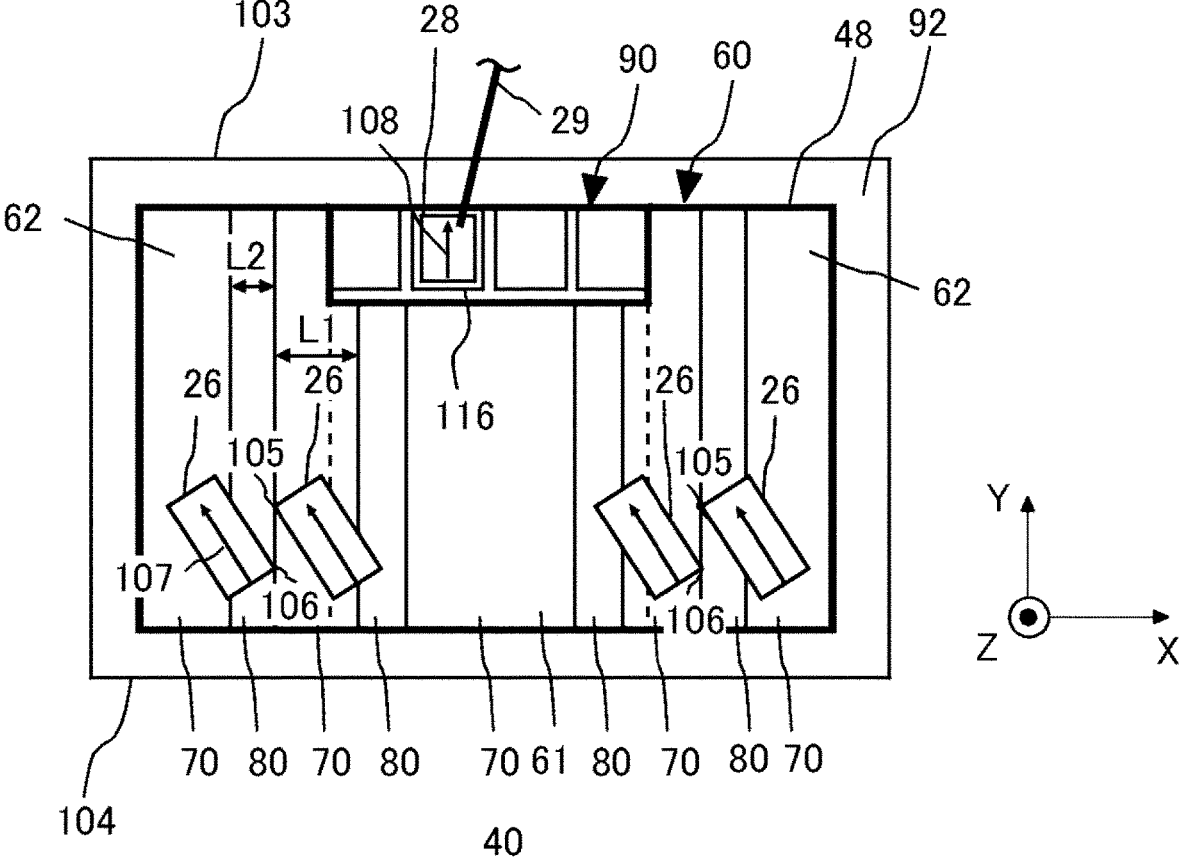
FIG. 2 illustrates an example of an arrangement of bonding portions 26 and a gate bonding portion 28 in a semiconductor chip 40.

The control circuit portion 30 is connected to a gate electrode pad 116 (see FIG. 2) of the semiconductor chip 40 via a gate wire 29 (see FIG. 2). The control circuit portion 30 is configured to control the semiconductor chip 40 by controlling a voltage applied to the gate electrode pad 116 of the semiconductor chip 40. The control circuit portion 30 is connected to an external electrode via a control terminal 88. Note that in FIG. 1, a circuit configuration of the control circuit portion 30 is omitted.

The plurality of main terminal circuit portions 22 are connected to the main electrodes 60 (see FIG. 2) or the back surface electrodes of the plurality of semiconductor chips 40 via the circuit electrodes 24 and wires 27. The plurality of main terminals 86 may be connected to the plurality of circuit electrodes 24. The plurality of circuit electrodes 24 may be connected to the main electrodes 60 of the plurality of semiconductor chips 40. The plurality of main terminals 86 may be connected to the main electrodes 60 or the back surface electrodes of the plurality of semiconductor chips 40. A main terminal circuit portion 22 may be connected to the external electrode via the main terminal 86. By connecting the main terminal circuit portion 22 to the main electrode

60 or the back surface electrode of the semiconductor chip 40, a current flowing in the main terminal 86 in the semiconductor module 100 can be controlled.

In addition, the plurality of main terminals 86 may be arranged on a same side in relation to the main circuit portion 50 so as not to sandwich the main circuit portion 50 in a top view. The plurality of control terminals 88 may be arranged on a same side in relation to the main circuit portion 50 so as not to sandwich the main circuit portion 50 in a top view. In the present example, the plurality of main terminals 86 are provided along an end side 101 of the resin casing 10, and the plurality of control terminals 88 are provided along an end side 102 of the resin casing 10. A side on which the plurality of main terminals 86 are arranged in relation to the main circuit portion 50 in a top view is set as a main terminal side. In addition, a side on which the plurality of control terminals 88 are arranged in relation to the main circuit portion 50 in a top view is set as a control terminal side.

The wire 27 connects the main electrode 60 of the semiconductor chip 40 and the circuit electrode 24 to each other. In the present example, the plurality of wires 27 connect the main electrodes 60 of the plurality of semiconductor chips 40 and the plurality of circuit electrodes 24 to each other. In addition, the wire 27 connects the circuit electrode 24 and the main terminal circuit portion 22 to each other. In the present example, the plurality of wires 27 extend from the main electrode 60 towards the main terminal side. The gate wire 29 connects the gate electrode pad 116 of the semiconductor chip 40 and the control circuit portion 30 to each other. In the present example, the gate wire 29 extends from the main electrode 60 towards the control terminal side. That is, the gate wire 29 extends from the main electrode 60 towards a side opposite to the main terminal side. Note that in FIG. 2, of the gate wire 29, only a gate bonding portion 28 in contact with the gate electrode pad 116 is described. The wire 27 and the gate wire 29 are aluminum wires as an example.

The resin casing 10 is provided so as to surround a space 94 containing the main circuit insulated substrate 20, the main terminal circuit portion 22, and the control circuit portion 30. The semiconductor chip 40 is protected by the resin casing 10 or a resin package such as sealing resin (not illustrated) filled in the resin casing 10.

The plurality of main terminals 86 may be provided so as to protrude from the resin casing 10. The plurality of control terminals 88 may be provided so as to protrude from the resin casing 10. In addition, a through hole 84 through which a fastening member such as a screw for fixing a cooling portion or the like may be provided in the resin casing 10.

In the present example, the resin casing 10 is molded using resin such as thermosetting resin formable by injection molding or ultraviolet curable resin formable by UV molding. The resin may include, for example, one or more polymer materials selected from polyphenylene sulfide (PPS) resin, polybutylene terephthalate (PBT) resin, polyamide (PA) resin, acrylonitrile butadiene styrene (ABS) resin, acrylic resin, and the like.

FIG. 2 illustrates an example of an arrangement of the bonding portions 26 and the gate bonding portion 28 in the semiconductor chip 40. In FIG. 2, of the wire 27, a portion in contact with the semiconductor chip 40 is illustrated as the bonding portion 26. In addition, in FIG. 2, of the gate wire 29, a portion in contact with the semiconductor chip 40 is illustrated as the gate bonding portion 28. At least one of the semiconductor chip 40-1, the semiconductor chip 40-2, the semiconductor chip 40-3, the semiconductor chip 40-4, the semiconductor chip 40-5, or the semiconductor chip 40-6 may have a configuration of the semiconductor chip 40 of FIG. 2. Any of the semiconductor chip 40-1, the semiconductor chip 40-2, the semiconductor chip 40-3, the semiconductor chip 40-4, the semiconductor chip 40-5, or the semiconductor chip 40-6 may have the configuration of the semiconductor chip 40 of FIG. 2.

In FIG. 2, the semiconductor chip 40 has a gate runner 48, the main electrode 60, a pad region 90, and an edge termination structure portion 92. That is, the gate runner 48, the main electrode 60, the pad region 90, and the edge termination structure portion 92 are provided on the upper surface in the semiconductor chip 40. In FIG. 2, of a region surrounded by the gate runner 48, the main electrode 60 is a region that is not the pad region 90. The main electrode 60 is an emitter electrode as an example. In addition, the main electrode 60 has a first portion 61 and two second portions 62. The first portion 61 opposes the pad region 90 in a top view. In the present example, a portion of the main electrode 60 facing the pad region 90 in the Y axis direction is set as the first portion 61. The two second portions 62 does not oppose the pad region 90 in a top view but does sandwich the first portion 61 in a top view. In FIG. 2, a boundary between the first portion 61 and the second portion 62 is indicated by a dotted line.

The semiconductor chip 40 includes transistor portions 70 and diode portions 80. The transistor portions 70 and the diode portions 80 are provided in a region where the main electrode 60 is provided. The transistor portions 70 and the diode portions 80 have longitudinal sides in a second direction. In the present example, the second direction is the Y axis direction. The transistor portions 70 and the diode portions 80 may be alternately arranged along a third direction perpendicular to the second direction. In the present example, the third direction is the X axis direction. The third direction may be the same direction as the first direction. A configuration may be adopted where the third direction is not the same direction as the first direction. In FIG. 2, the number of transistor portions 70 provided is higher than that of diode portions 80 provided. In FIG. 2, five transistor portions 70 and four diode portions 80 are provided. In FIG. 2, the transistor portion 70 is provided at an end in the X axis direction of the region where the main electrode 60 is provided.

In addition, a minimal width of the transistor portion 70 is set as L1, and a minimal width of the diode portion 80 is set as L2. In FIG. 2, among the five transistor portions 70, widths of the transistor portions 70 other than the transistor portion 70 provided at a center are L1. In addition, widths of the four diode portions 80 are L2.

A plurality of electrode pads may be provided in the pad region 90. In the present example, four electrode pads are provided in the pad region 90. One gate electrode pad 116 may be provided in the pad region 90. An electrode pad other than the gate electrode pad 116 is, for example, a pad for temperature measurement or a pad for current measurement. The pad region 90 may be arranged so as to be closer to a center of the semiconductor chip 40 in the X axis direction.

The semiconductor chip 40 may have a plurality of end sides in a top view. The semiconductor chip 40 may have a gate-side end side 103 with a closest distance to the gate electrode pad 116 in a top view. An end side on an opposite side to the gate-side end side 103 is set as an end side 104. In FIG. 1, the gate-side end side 103 of each of the semiconductor chips 40 may be arranged facing a same side in a top view. That is, the gate electrode pad 116 of each of the semiconductor chips 40 may be arranged on a same side.

In FIG. 1, the gate electrode pad 116 is arranged on the control circuit portion 30 side. In addition, the gate-side end side 103 is arranged facing the control terminal side. That is, the gate-side end side 103 is arranged facing a side opposite side to the main terminal side.

The gate runner 48 is electrically connected to the gate electrode pad 116 so as to surround the main electrode 60 and the pad region 90. In FIG. 2, the gate runner 48 is indicated by a bold line. The gate runner 48 is electrically connected to a conductive portion made of polysilicon or the like which is provided in a gate trench of the transistor portion 70. The gate runner 48 is formed of a conductive material such as polysilicon.

The semiconductor chip 40 may have the edge termination structure portion 92 surrounding the main electrode 60, the pad region 90, and the gate runner 48. The edge termination structure portion is arranged to alleviate electric field crowding on the upper surface side of the semiconductor chip 40. The edge termination structure portion has a structure of, for example, a guard ring, a field plate, resurf, and a combination of these.

In FIG. 2, each of the wires 27 has the bonding portion 26 connected to the main electrode 60. The main electrode 60 is connected to the plurality of bonding portions 26. In the present example, four bonding portions 26 are arranged. The bonding portions 26 may have longitudinal sides. In FIG. 2, a longitudinal direction 107 of the bonding portion 26 is indicated by an arrow on the bonding portion 26. The bonding portions 26 are arranged by wire bonding. The bonding portions 26 may be arranged on a side of the end side 104 that is a side opposite to the gate-side end side 103. When the bonding portion 26 is arranged on the side of the end side 104, interference with the gate wire 29 can be avoided.

When the transistor portion 70 operates, the transistor portion 70 generates heat. Accordingly, a rise in the temperature occurs in the bonding portion 26. Due to the rise in the temperature, reliability of the semiconductor module 100 falls. Accordingly, to suppress the rise in the temperature, the bonding portions 26 are preferably arranged in both the transistor portion 70 and the diode portion 80.

To arrange the bonding portions 26 in both the transistor portion 70 and the diode portion 80, it is conceivable to reduce a width of the transistor portion 70 and a width of the diode portion 80. When the width of the transistor portion 70 and the width of the diode portion 80 are to be reduced, a characteristic of the semiconductor chip 40 may vary. In addition, it is conceivable to enlarge a width of the bonding portion 26, but the semiconductor module 100 increases in size. In addition, it is also conceivable to arrange a longitudinal side of the bonding portion 26 so as to be perpendicular to the longitudinal direction of the transistor portion 70 and the diode portion 80, but a direction of the wire 27 is restricted.

In the present example, the longitudinal direction 107 of the bonding portion 26 has an angle in relation to the second direction. That is, the longitudinal direction 107 of the bonding portion 26 has an angle in relation to the Y axis direction. A configuration may be adopted where the angle defined by the longitudinal direction 107 of the bonding portion 26 and the Y axis direction is not 0 degrees. That is, a configuration may be adopted where the longitudinal direction 107 of the bonding portion 26 and the Y axis direction are not in parallel to each other. A configuration may be adopted where the angle defined by the longitudinal direction 107 of the bonding portion 26 and the Y axis direction is not 90 degrees. That is, a configuration may be adopted where the longitudinal direction 107 of the bonding portion 26 is not perpendicular to the Y axis direction. The angle defined by the longitudinal direction 107 of the bonding portion 26 and the Y axis direction may be 10 degrees or more. The angle defined by the longitudinal direction 107 of the bonding portion 26 and the Y axis direction may be 20 degrees or more. The angle defined by the longitudinal direction 107 of the bonding portion 26 and the Y axis direction may be 80 degrees or less. The angle defined by the longitudinal direction 107 of the bonding portion 26 and the Y axis direction may be 70 degrees or less.

Since the longitudinal direction 107 of the bonding portion 26 has an angle in relation to the second direction, the bonding portions 26 are easily arranged in both the transistor portion 70 and the diode portion 80. That is, the bonding portions 26 may be overlapped with at least a part of the transistor portion 70 and at least a part of the diode portion 80 in a top view. Accordingly, the rise in the temperature in the bonding portion 26 can be suppressed, and the fall in the reliability of the semiconductor module 100 can be avoided. In addition, without changing the width of the transistor portion 70 or the width of the diode portion 80 or the bonding portion 26, the fall in the reliability of the semiconductor module 100 can be avoided. The direction of the wire 27 is not restricted, so that the fall in the reliability of the semiconductor module 100 can be avoided.

The angle defined by the longitudinal direction 107 of the bonding portion 26 and the Y axis direction may be the same in each of the semiconductor chips 40 of FIG. 1. For example, the angle defined by the longitudinal direction 107 of the bonding portion 26 and the Y axis direction is the same in the four bonding portions 26 arranged in the semiconductor chip 40-1. When such a configuration is adopted, the plurality of bonding portions 26 can be arranged at the same bonding setting in the semiconductor chip 40, and the plurality of bonding portions 26 can be arranged in a short period of time. In addition, in this case, the angle defined by the longitudinal direction 107 of the bonding portion 26 and the Y axis direction may be different or may be the same among the respective semiconductor chips 40 in FIG. 1.

A position in the third direction of at least a part of the bonding portion 26 may be the same as a position in the third direction of at least a part of another adjacent one of the bonding portions 26 in the semiconductor chip 40. That is, at least a part of the bonding portion 26 and at least a part of another adjacent one of the bonding portions 26 may be overlapped with each other in the third direction. In the present example, a position in the third direction of a corner 105 at an end on a side of the gate-side end side 103 in the longitudinal direction 107 of the bonding portion 26 is the same as a position in the third direction of a corner 106 at an end on the side of the end side 104 in the longitudinal direction 107 of another adjacent one of the bonding portions 26 in the semiconductor chip 40. When such a configuration is adopted, a number of at least one transistor portion 70 or diode portion 80 in which the bonding portion 26 is not provided can be reduced, and current crowding can be avoided, so that the fall in the reliability of the semiconductor module 100 can be avoided.

In FIG. 2, the gate wire 29 has the gate bonding portion 28 connected to the gate electrode pad 116. The gate electrode pad 116 is connected to the gate bonding portion 28. In the present example, one gate bonding portion 28 is arranged. The gate bonding portion 28 is arranged by wire bonding. The gate bonding portion 28 may have a longitudinal side. In FIG. 2, a gate longitudinal direction 108 of the gate bonding portion 28 is indicated by an arrow on the gate bonding portion 28.

In the present example, the gate longitudinal direction 108 of the gate bonding portion 28 has an angle in relation to the longitudinal direction 107 of the bonding portion 26. In FIG. 2, the gate longitudinal direction 108 of the gate bonding portion 28 is the Y axis direction. That is, the gate longitudinal direction 108 of the gate bonding portion 28 may be parallel to the second direction. When such a configuration is adopted, the gate wire 29 can be easily arranged.

Figure 3:
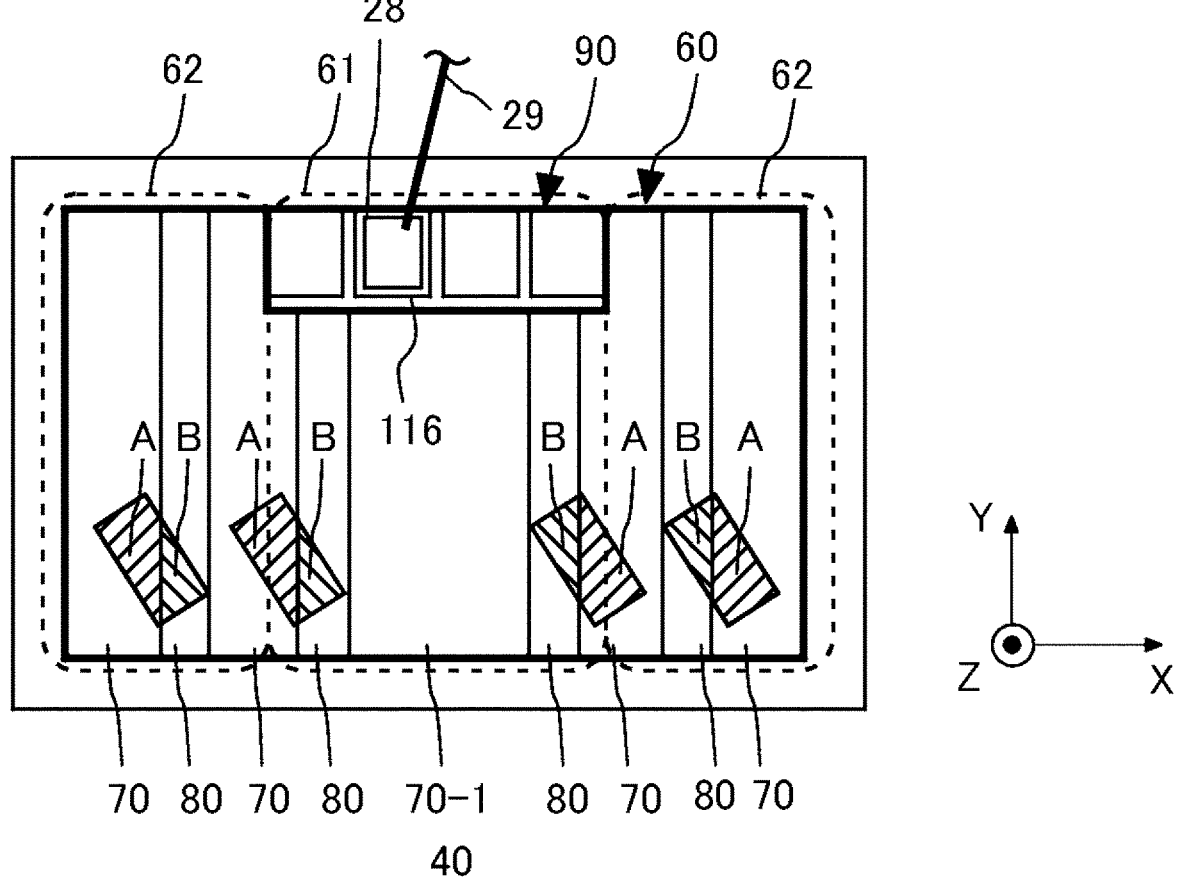
FIG. 3 illustrates another example of the arrangement of the bonding portions 26 and the gate bonding portion 28 in the semiconductor chip 40.

FIG. 3 illustrates another example of the arrangement of the bonding portions 26 and the gate bonding portion 28 in the semiconductor chip 40. The semiconductor chip 40 of FIG. 3 is different from the semiconductor chip 40 of FIG. 2 in the arrangement of the bonding portions 26. The other configuration of FIG. 3 may be the same as FIG. 2. In FIG. 3, a region where the bonding portion 26 is overlapped with the transistor portion 70 is set as a region A, and a region where the bonding portion 26 is overlapped with the diode portion 80 is set as a region B. In FIG. 3, the region A and the region B are indicated by hatchings in different directions.

A ratio of an area of the region A to an area of the region B is preferably the same among the plurality of bonding portions 26. A state in which the ratio of the area of the region A to the area of the region B is the same may include a state in which the ratio is the same even when the areas of the bonding portions 26 have fluctuations of ±10%. In the present example, the ratio of the area of the region A to the area of the region B is all the same among the four bonding portions 26. When a ratio of the area of the region where the bonding portion 26 is overlapped with the transistor portion 70 to the area of the region where the bonding portion 26 is overlapped with the diode portion 80 is set to be the same among the plurality of bonding portions 26, an equivalent current tends to flow in the wire 27 connected to each of the bonding portions 26, and excessive heat generation of the wire 27 can be suppressed.

The transistor portion 70 may be formed in the first portion 61. In addition, the transistor portion 70 at the center of the main electrode 60 is set as a transistor portion 70-1. A configuration may be adopted where the bonding portion 26 is not formed in the transistor portion 70-1. In the present example, the transistor portion 70-1 is also the transistor portion 70 at the center of the first portion 61. With the presence of the transistor portion 70-1, a gate current from the gate electrode pad 116 promptly flows to the transistor portion 70-1, and swift switching including the surrounding transistor portions 70 is enabled. In addition, since the wire 27 is not directly connected to the transistor portion 70-1, excessive current crowding closer to the center of the semiconductor chip 40 can be avoided. On the other hand, the bonding portions 26 are preferably formed in the transistor portions 70 other than the transistor portion 70-1. In addition, the bonding portions 26 are preferably formed in all the diode portions 80.

A density of the bonding portions 26 arranged in the first portion 61 in a top view may be lower than a density of the bonding portions 26 arranged in the second portions 62 in a top view. That is, the density of the bonding portions 26 arranged to be closer to the center of the semiconductor chip 40 may be lower than the density of the bonding portions 26 arranged on an outer side of the semiconductor chip 40. Current crowding is more likely to occur at a central site of the semiconductor chip 40 and the temperature is more likely to rise as compared with the outer side of the semiconductor chip 40. Accordingly, by arranging the bonding portions 26 while avoiding the central site of the semiconductor chip 40 where the rise in the temperature is likely to occur, the fall in the reliability of the semiconductor module 100 can be further avoided.

Figure 4:
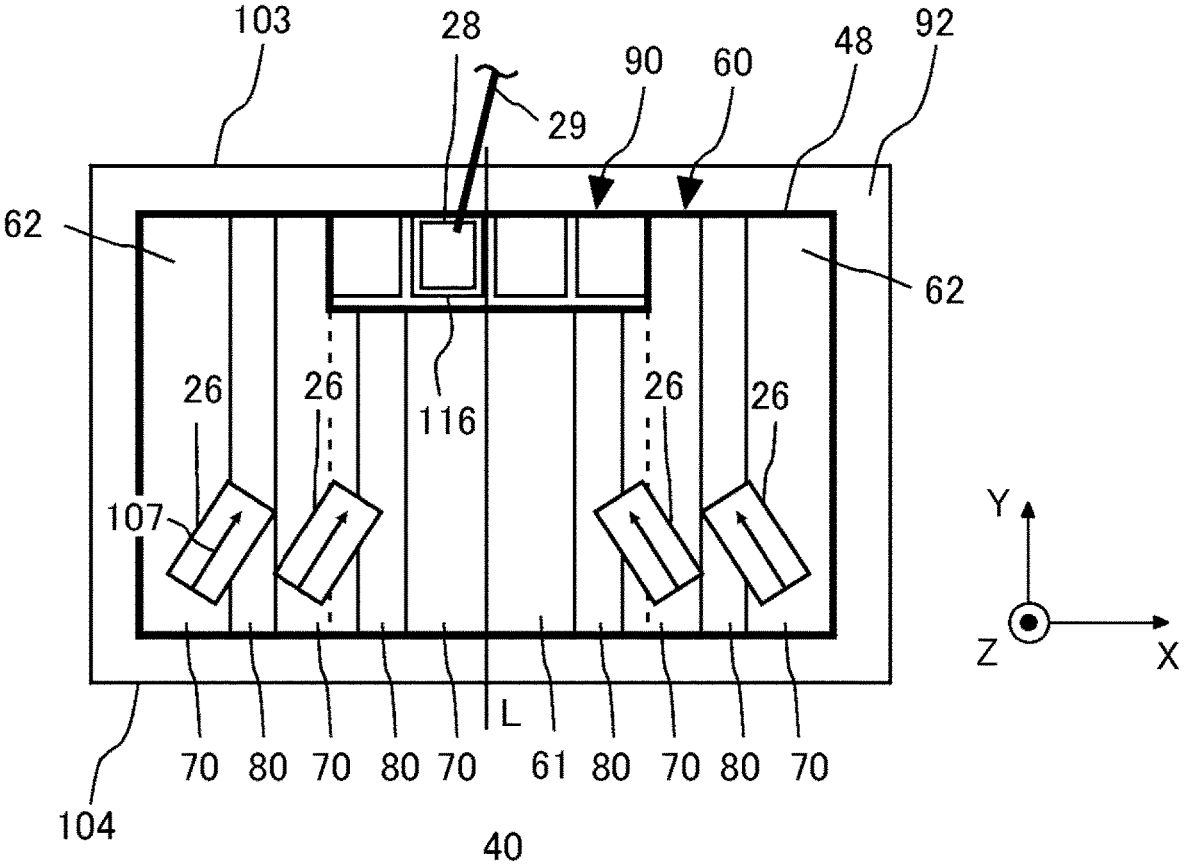
FIG. 4 illustrates another example of the arrangement of the bonding portions 26 and the gate bonding portion 28 in the semiconductor chip 40.

FIG. 4 illustrates another example of the arrangement of the bonding portions 26 and the gate bonding portion 28 in the semiconductor chip 40. The semiconductor chip 40 of FIG. 4 is different from the semiconductor chip 40 of FIG. 2 in the arrangement of the bonding portions 26. The other configuration of FIG. 4 may be the same as FIG. 2.

In the present example, the bonding portions 26 are arranged to be line symmetric while a center line L is set as a reference passing through the center of the third direction in the semiconductor chip 40. When such a configuration is adopted, the direction of the wire 27 can be changed, and miniaturization of the semiconductor module 100 can be realized.

Figure 5:
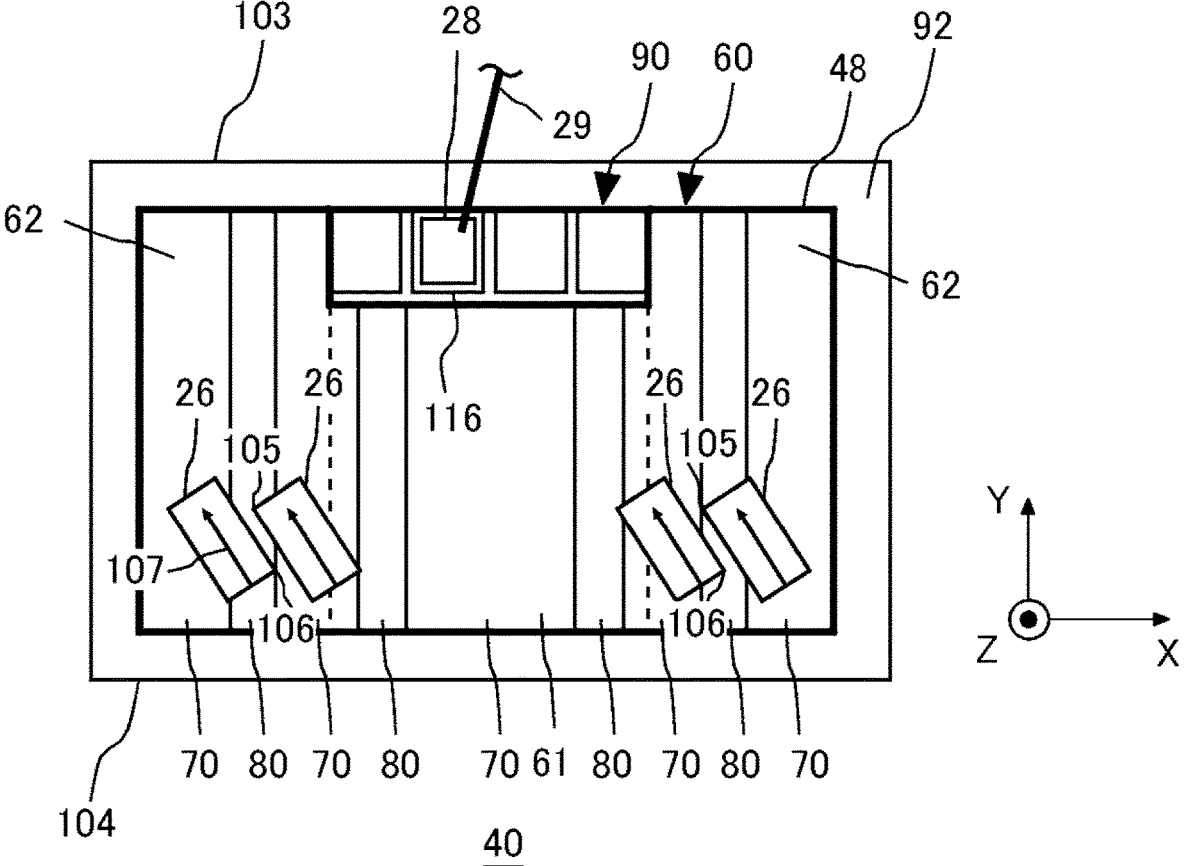
FIG. 5 illustrates another example of the arrangement of the bonding portions 26 and the gate bonding portion 28 in the semiconductor chip 40.

FIG. 5 illustrates another example of the arrangement of the bonding portions 26 and the gate bonding portion 28 in the semiconductor chip 40. The semiconductor chip 40 of FIG. 5 is different from the semiconductor chip 40 of FIG. 2 in the arrangement of the bonding portions 26. The other configuration of FIG. 5 may be the same as FIG. 2.

In the present example, the region where the bonding portion 26 is overlapped with another adjacent one of the bonding portions 26 is larger as compared with FIG. 2. That is, the position in the third direction of the corner 105 at the end on the side of the gate-side end side 103 in the longitudinal direction 107 of the bonding portion 26 may be different from the position in the third direction of the corner 106 at the end on the side of the end side 104 in the longitudinal direction 107 of another adjacent one of the bonding portion 26 in the semiconductor chip 40. When such a configuration is adopted too, the fall in the reliability of the semiconductor module 100 can be avoided.

Figure 6:
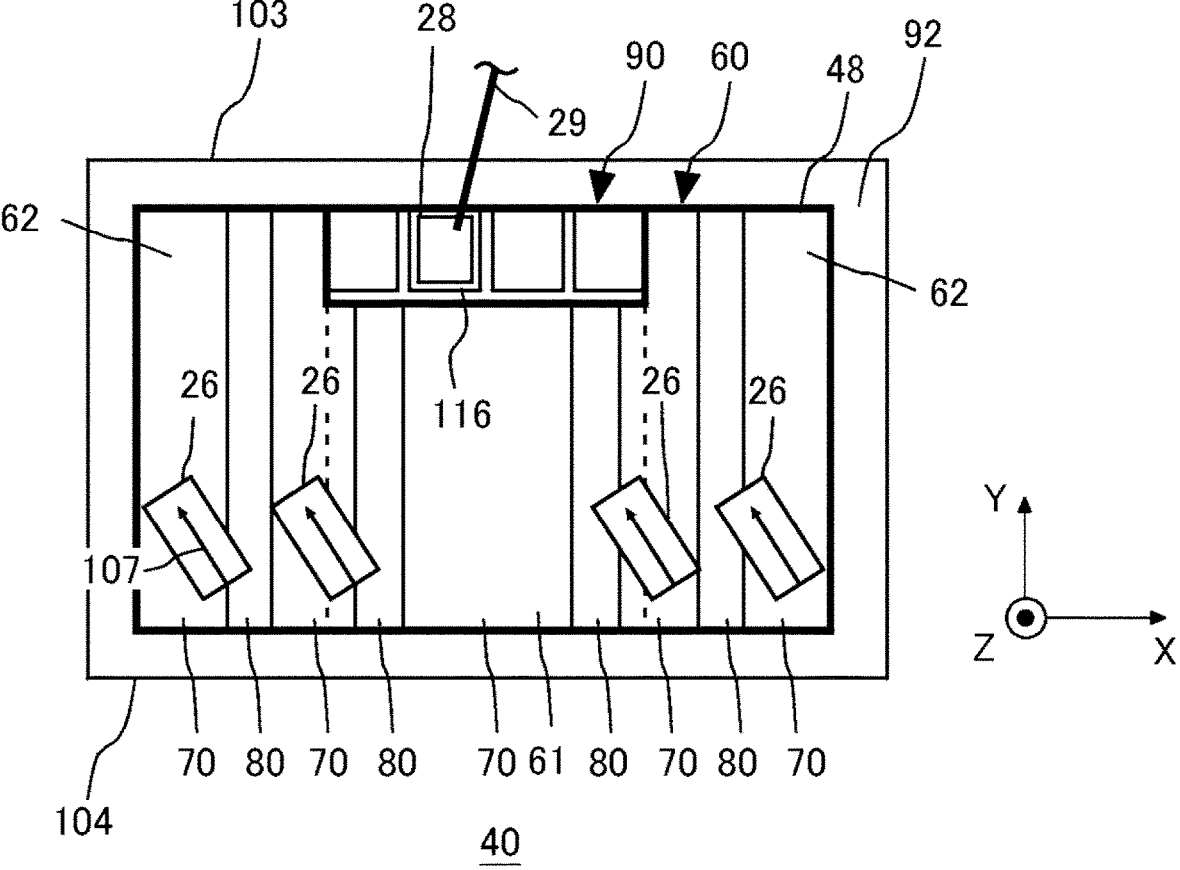
FIG. 6 illustrates another example of the arrangement of the bonding portions 26 and the gate bonding portion 28 in the semiconductor chip 40.

FIG. 6 illustrates another example of the arrangement of the bonding portions 26 and the gate bonding portion 28 in the semiconductor chip 40. The semiconductor chip 40 of FIG. 6 is different from the semiconductor chip 40 of FIG. 2 in the arrangement of the bonding portions 26. The other configuration of FIG. 6 may be the same as FIG. 2.

In the present example, in at least one bonding portion 26, the area where the bonding portion 26 is overlapped with the transistor portion 70 in a top view is larger than the area where the bonding portion 26 is overlapped with the diode portion 80 in a top view. In FIG. 6, in the four bonding portions 26, the area where the bonding portion 26 is overlapped with the transistor portion 70 in a top view is larger than the area where the bonding portion 26 is overlapped with the diode portion 80 in a top view. Preferably, the area where the bonding portion 26 is overlapped with the transistor portion 70 is 50% or more and 80% or less of the bonding portion 26. When the semiconductor module 100 operates as an inverter, more currents are more likely to flow in the transistor portion 70 as compared with the diode portion 80. Accordingly, by enlarging the area where the bonding portion 26 is overlapped with the transistor portion 70, the rise in the temperature of the bonding portion 26 can be suppressed, and the fall in the reliability of the semiconductor module 100 can be avoided.

Figure 7:
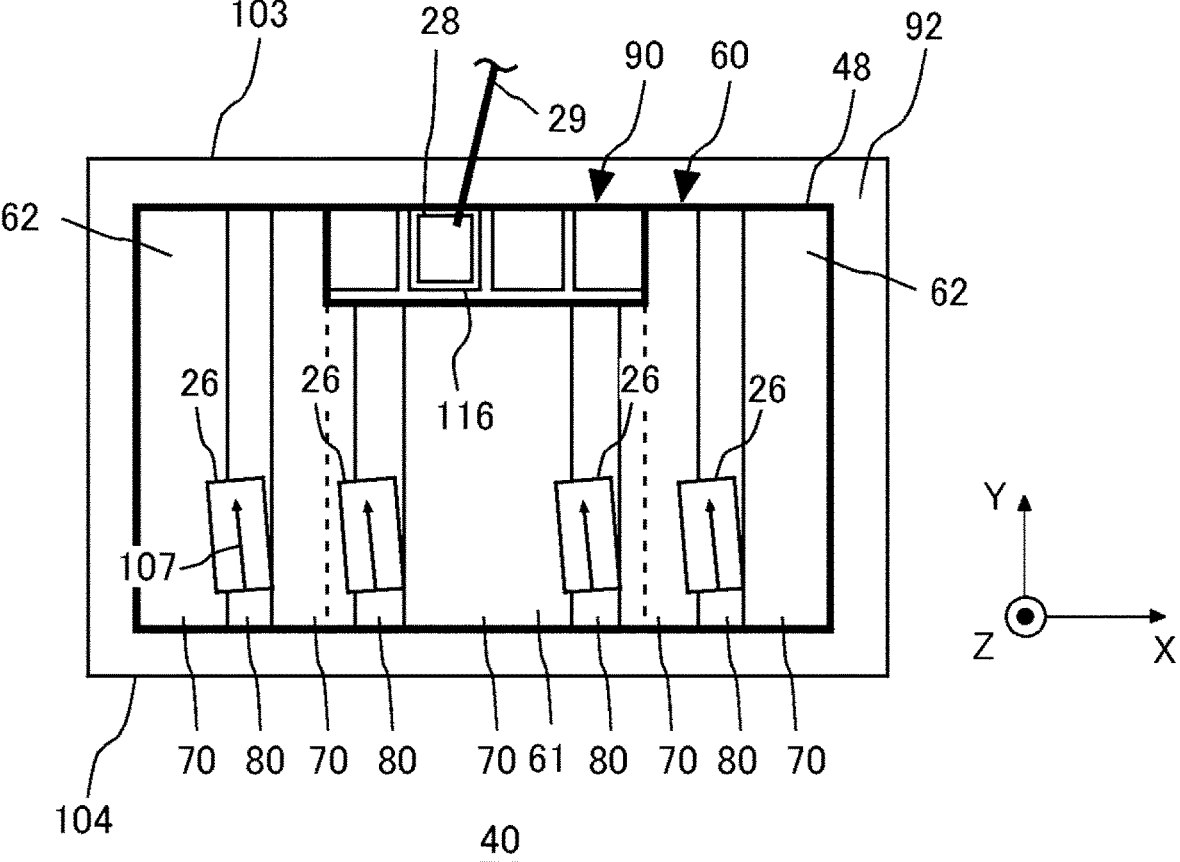
FIG. 7 illustrates another example of the arrangement of the bonding portions 26 and the gate bonding portion 28 in the semiconductor chip 40.

FIG. 7 illustrates another example of the arrangement of the bonding portions 26 and the gate bonding portion 28 in the semiconductor chip 40. The semiconductor chip 40 of FIG. 7 is different from the semiconductor chip 40 of FIG. 2 in the arrangement of the bonding portions 26. The other configuration of FIG. 7 may be the same as FIG. 2.

In the present example, in at least one bonding portion 26, the area where the bonding portion 26 is overlapped with the diode portion 80 in a top view is larger than the area where the bonding portion 26 is overlapped with the transistor portion 70 in a top view. In FIG. 7, in the four bonding portions 26, the area where the bonding portion 26 is overlapped with the diode portion 80 in a top view is larger than the area where the bonding portion 26 is overlapped with the transistor portion 70 in a top view. Preferably, the area where the bonding portion 26 is overlapped with the diode portion 80 is 50% or more and 80% or less of the bonding portion 26. When the semiconductor module 100 operates as a converter, more currents are more likely to flow in the diode portion 80 as compared with the transistor portion 70. Accordingly, by enlarging the area where the bonding portion 26 is overlapped with the diode portion 80, the rise in the temperature of the bonding portion 26 can be suppressed, and the fall in the reliability of the semiconductor module 100 can be avoided.

Figure 8:
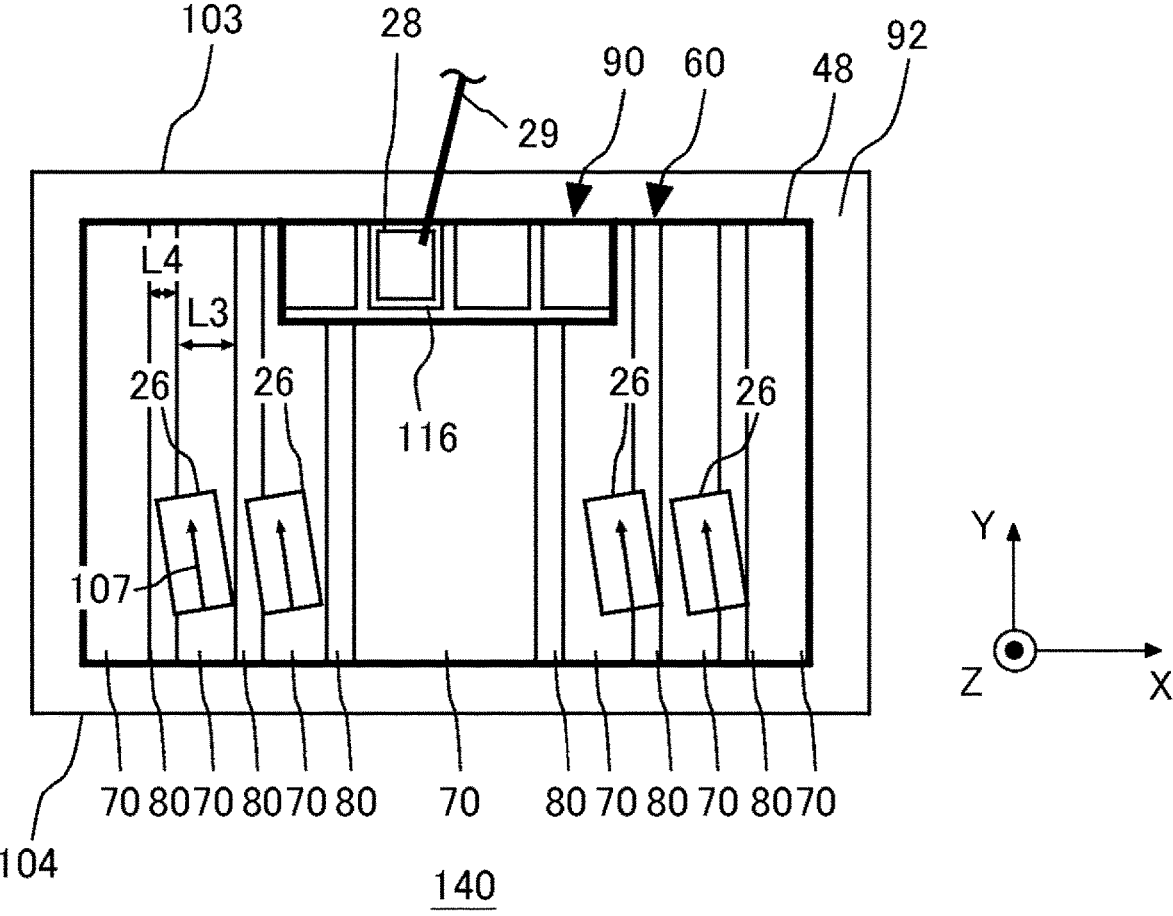
FIG. 8 illustrates an example of an arrangement of the bonding portions 26 and the gate bonding portion 28 in a semiconductor chip 140.

FIG. 8 illustrates an example of an arrangement of the bonding portion 26 and the gate bonding portion 28 in a semiconductor chip 140. The semiconductor chip 140 of FIG. 8 is different from the semiconductor chip 40 of FIG. 2 in the arrangement of the transistor portions 70, the diode portions 80, and the bonding portions 26. The other configuration of FIG. 8 may be the same as FIG. 2.

In the semiconductor chip 140 of FIG. 8, seven transistor portions 70 and six diode portions 80 are provided. A minimal width of the transistor portion 70 in the X axis direction is set as L3, and a minimal width of the diode portion 80 is set as L4. The width of the transistor portion 70 and the width of the diode portion 80 may be measured in the positions where the bonding portions 26 are arranged on the Y axis. In the semiconductor chip 140 of FIG. 8, among the seven transistor portions 70, the widths of the transistor portions 70 other than the transistor portion 70 provided at the center are L3. In addition, the widths of the six diode portions 80 are L4. L3 may be smaller than L1. L4 may be smaller than L2.

An angle defined by the longitudinal direction 107 of the bonding portion 26 in the semiconductor chip 140 of FIG. 8 and the second direction may be smaller than an angle defined by the longitudinal direction 107 of the bonding portion 26 in the semiconductor chip 40 of FIG. 2 and the second direction. In the semiconductor chip 140 of FIG. 8, widths of the transistor portions 70 other than the transistor portion 70 provided at the center are L3, and a width of the diode portion 80 is L4. Accordingly, even when the angle defined by the longitudinal direction 107 of the bonding portion 26 and the second direction is decreased, the bonding portions 26 can be arranged in both the transistor portion 70 and the diode portion 80. In addition, by decreasing the angle, wire bonding can be easily performed.

In the main circuit portion 50, a plurality of semiconductor chips with different minimal widths of the transistor portions 70 or different minimal widths of the diode portions 80 may be arranged. For example, in FIG. 1, the semiconductor chip 40-1, the semiconductor chip 40-2, and the semiconductor chip 40-3 may have the configuration of the semiconductor chip 140 of FIG. 8, and the semiconductor chip 40-4, the semiconductor chip 40-5, and the semiconductor chip 40-6 may have the configuration of the semiconductor chip 40 of FIG. 2. In this case, based on the minimal width of the transistor portion 70 or the minimal width of the diode portion 80, the angle defined by the longitudinal direction 107 of the bonding portion 26 and the second direction may vary. That is, the angle defined by the longitudinal direction 107 of the bonding portion 26 and the second direction in the semiconductor chip 40-1, the semiconductor chip 40-2, and the semiconductor chip 40-3 may be smaller than the angle defined by the longitudinal direction 107 of the bonding portion 26 and the second direction in the semiconductor chip 40-4, the semiconductor chip 40-5, and the semiconductor chip 40-6. Since the angle defined by the longitudinal direction 107 of the bonding portion 26 and the second direction is caused to vary based on the width of the transistor portion 70 or the diode portion 80, while the restriction of the direction of the wire 27 is avoided, the fall in the reliability of the semiconductor module 100 can be avoided.

Figure 9:
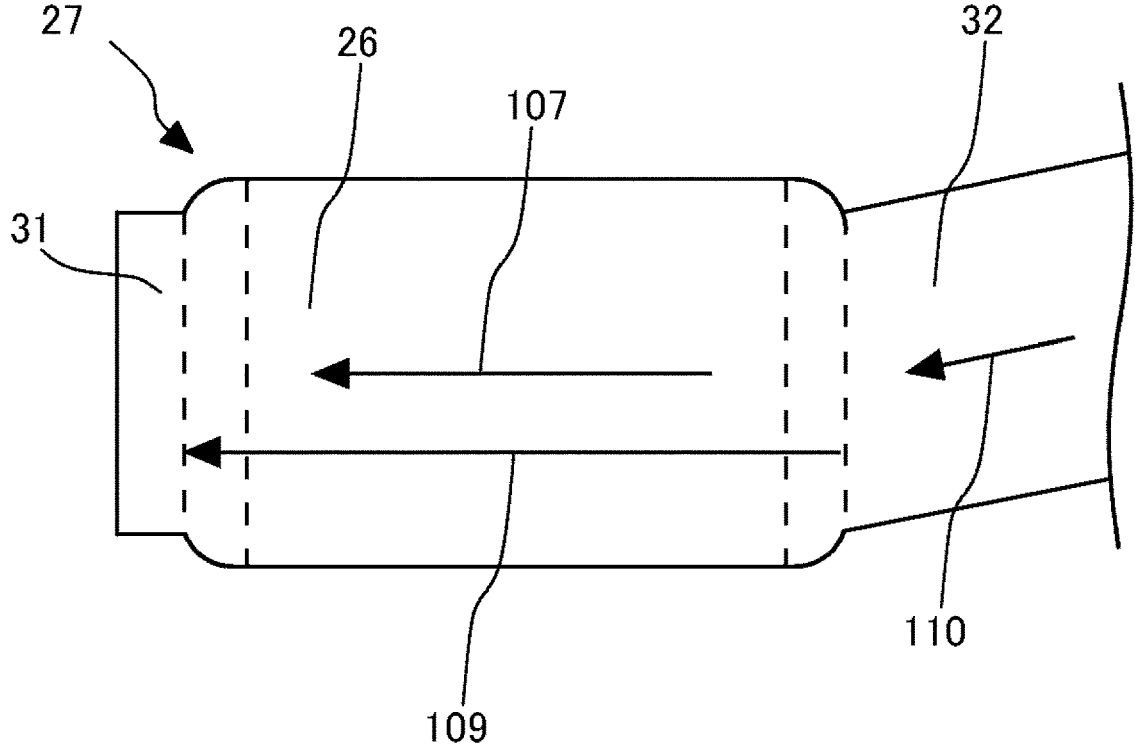
FIG. 9 is a diagram for describing a main part of the bonding portion 26 in a top view.

FIG. 9 is a diagram for describing a main part of the bonding portion 26 in a top view. In FIG. 9, the wire 27 has the bonding portion 26, an edge portion 31, and a neck portion 32. An extending direction of the wire 27 is set as a direction 110.

The edge portion 31 is one end of the wire 27. In addition, the neck portion 32 is connected to the bonding portion 26 on a side opposite to the edge portion 31. The bonding portion 26 is electrically connected to the circuit electrode 24 via a wire extending from the neck portion 32.

The longitudinal direction 107 of the bonding portion 26 is the same direction as a direction 109 that is a direction linking the edge portion 31 and the neck portion 32 to each other. That is, an angle defined by the longitudinal direction 107 of the bonding portion 26 and the direction 109 in a top view may be 5 degrees or less.

Figure 10:
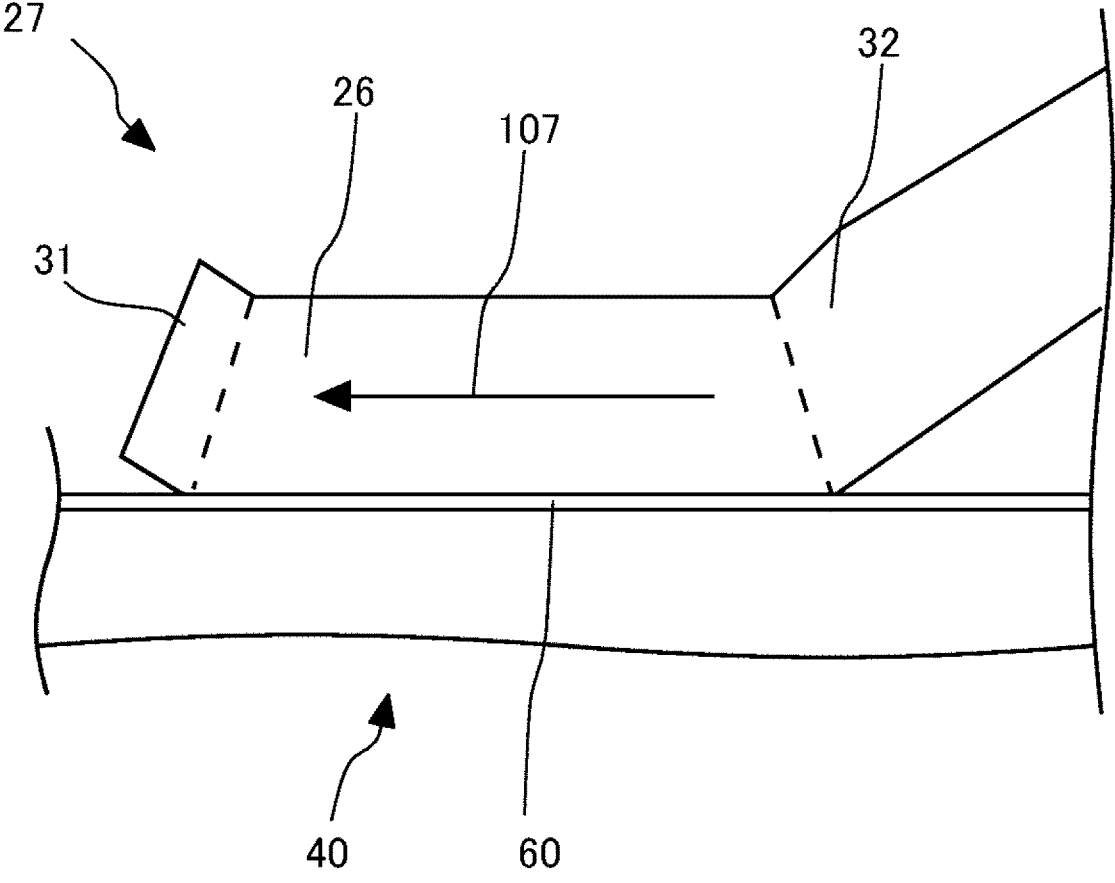
FIG. 10 is a diagram for describing the main part of the bonding portion 26 in a side view.

FIG. 10 is a diagram for describing the main part of the bonding portion 26 in a side view. In FIG. 10, the bonding portion 26 is connected to the main electrode 60.

The connection between the wire 27 and the main electrode 60 is executed by ultrasonic bonding as an example. Specifically, the upper surface of the bonding portion 26 corresponding to the extending direction of the wire 27 is held down onto the main electrode 60 using a bonding tool to be applied with ultrasonic waves for bonding. Therefore, the longitudinal direction 107 of the bonding portion 26 in a top view is the same as a direction 110 that is the extending direction of the wire 27 in a top view. That is, an angle defined by the longitudinal direction 107 of the bonding portion 26 and the direction 110 in a top view may be 5 degrees or less. In addition, when the upper surface of the bonding portion 26 corresponding to the extending direction of the wire 27 is held down onto the main electrode 60 using the bonding tool, the upper surface of the wire 27 is engaged with a groove at a bonding tool edge, so that the bonding portion 26 can be rotated in a predetermined direction. With this configuration, the longitudinal direction 107 of the bonding portion 26 in relation to the direction 110 that is the extending direction can be shifted by a predetermined angle. In this case, an angle defined by the longitudinal direction 107 of the bonding portion 26 and the direction 110 in a top view may be 30 degrees or less.

Figure 11:
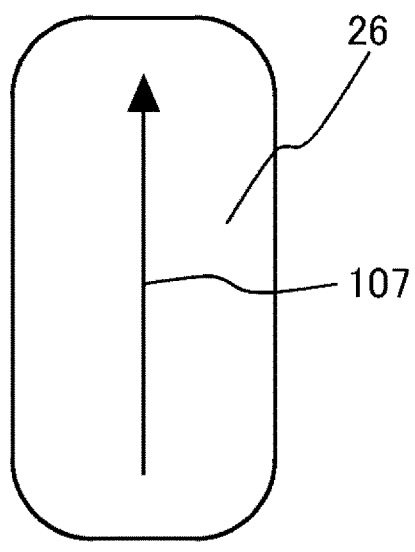
FIG. 11 illustrates an example of a shape of the bonding portion 26 in a top view.
Figure 12:
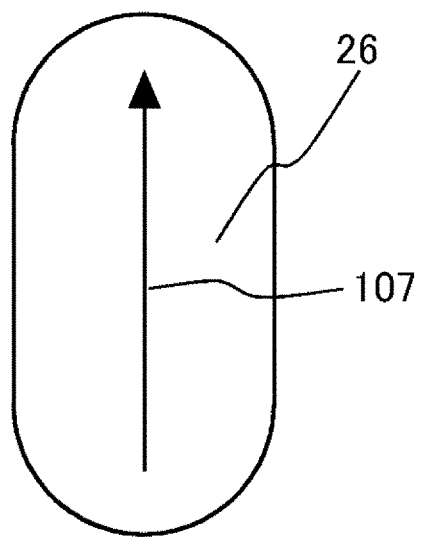
FIG. 12 illustrates an example of the shape of the bonding portion 26 in a top view.
Figure 13:
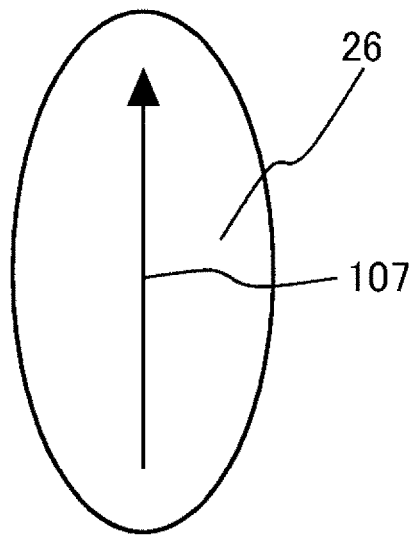
FIG. 13 illustrates an example of the shape of the bonding portion 26 in a top view.

FIG. 11, FIG. 12, and FIG. 13 illustrate an example of a shape of the bonding portion 26 in a top view. The shape of the bonding portion 26 in a top view is not necessarily limited to a rectangular shape as illustrated in FIG. 2 or the like. The shape of the bonding portion 26 in a top view may have a rectangular shape with a rounded corner (FIG. 11). The shape of the bonding portion 26 in a top view may have a long round shape (FIG. 12). The shape of the bonding portion 26 in a top view may have an elliptic shape (FIG. 13).

Figure 14:
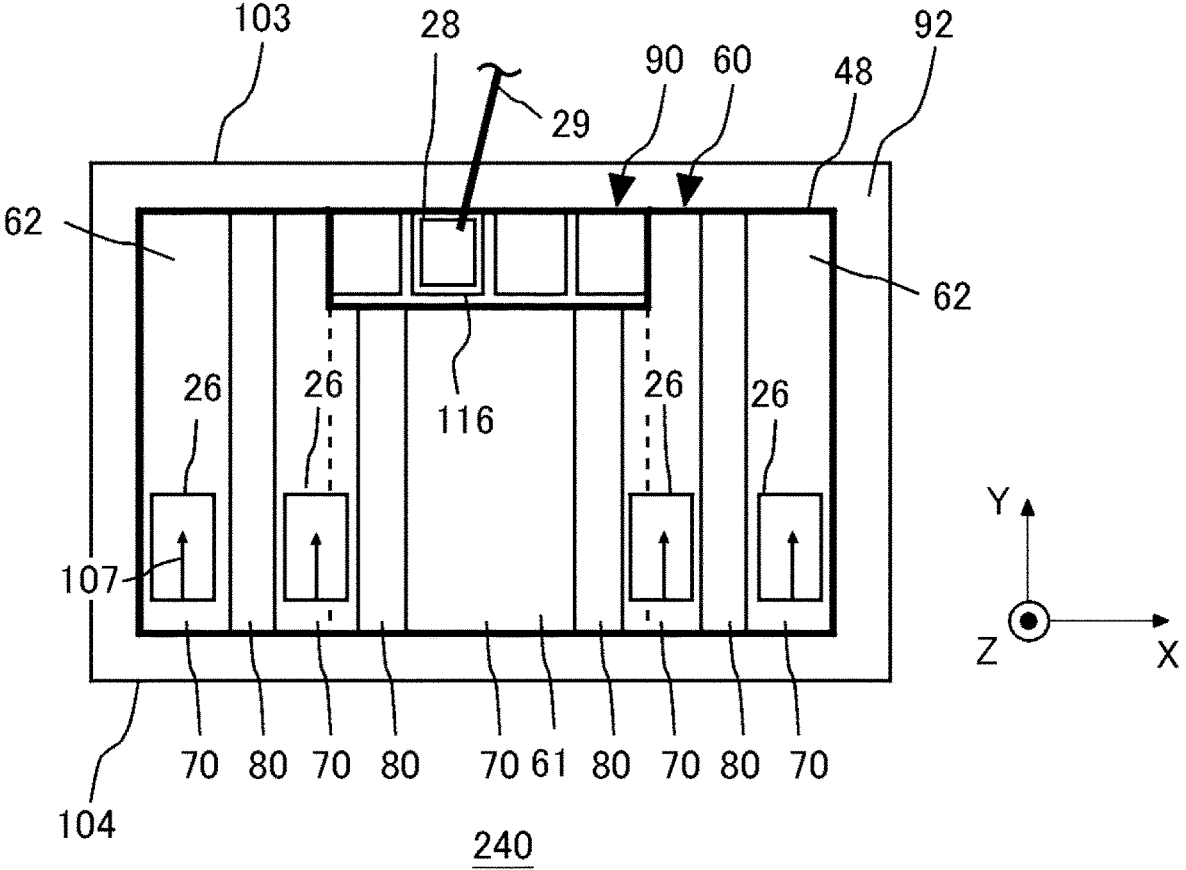
FIG. 14 illustrates an example of an arrangement of the bonding portions 26 and the gate bonding portion 28 in a semiconductor chip 240 according to a comparative example.

FIG. 14 illustrates an example of an arrangement of the bonding portions 26 and the gate bonding portion 28 in a semiconductor chip 240 according to a comparative example. In the semiconductor chip 240 of FIG. 14, the longitudinal direction 107 of the bonding portion 26 of the wire 27 is parallel to the Y axis direction. In this case, as illustrated in FIG. 14, the bonding portions 26 may be arranged in only the transistor portions 70. In the case of the arrangements in only the transistor portions 70, when the transistor portions 70 operate, the rise in the temperature occurs in the bonding portions 26, and reliability of the semiconductor module 100 falls.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

Explanation of References 10 resin casing, 20 main circuit insulated substrate, 22 main terminal circuit portion, 24 circuit electrode, 26 bonding portion, 27 wire, 28 gate bonding portion, 29 gate wire, 30 control circuit portion, 31 edge portion, 32 neck portion, 40 semiconductor chip, 48 gate runner, 50 main circuit portion, 60 main electrode, 61 first portion, 62 second portion, 70 transistor portion, 80 diode portion, 84 through hole, 86 main terminal, 88 control terminal, 90 pad region, 92 edge termination structure portion, 94 space, 100 semiconductor module, 101 end side, 102 end side, 103 gate-side end side, 104 end side, 105 corner, 106 corner, 107 longitudinal direction, 108 gate longitudinal direction, 109 direction, 110 direction, 116 gate electrode pad, 140 semiconductor chip, 240 semiconductor chip

What is claimed is:

1. A semiconductor module comprising:

a main circuit portion in which semiconductor chips are arrayed and arranged along a first direction, each of the semiconductor chips including transistor portions and diode portions and having a gate electrode pad and a main electrode provided on an upper surface thereof, wherein the main electrode extends over the transistor portions and the diode portions thereof;

a plurality of circuit electrodes connected to the main electrodes of a plurality of the semiconductor chips;

a plurality of main terminals connected to the plurality of circuit electrodes; and a plurality of wires connecting the main electrodes of the plurality of the semiconductor chips and the plurality of circuit electrodes to each other, wherein in each of the semiconductor chips, the transistor portions and the diode portions have longitudinal sides in a second direction, and also the transistor portions and the diode portions are alternately arranged in a third direction perpendicular to the second direction, each of the semiconductor chips has a plurality of end sides including a gate-side end side with a closest distance to the gate electrode pad in a top view, the gate-side end side of each of the semiconductor chips is arranged facing a same side in a top view, the plurality of main terminals are arranged on a main terminal side in relation to the main circuit portion so as not to sandwich the main circuit portion in a top view, each of the plurality of wires has a bonding portion connected to the main electrode of a corresponding one of the plurality of the semiconductor chips, each of the bonding portions has a longitudinal direction in a top view, the longitudinal direction of the bonding portion has an angle in relation to the second direction, and each of the bonding portions overlaps at least a part of one of the transistor portions and at least a part of one of the diode portions in a top view.

2. The semiconductor module according to claim 1, wherein an angle defined by the longitudinal direction of the bonding portion and the second direction is 10 degrees or more and 80 degrees or less.

3. The semiconductor module according to claim 1, wherein an angle defined by the longitudinal direction of the bonding portion and the second direction is the same in each of the plurality of the semiconductor chips.

4. The semiconductor module according to claim 1, wherein the main electrode is connected to a plurality of the bonding portions, and a position in the third direction of at least a part of the bonding portion is the same as a position in the third direction of at least a part of another adjacent one of the bonding portions in the third direction in the semiconductor chip.

5. The semiconductor module according to claim 4, wherein a position in the third direction of a corner at an end on a side of the gate-side end side in the longitudinal direction of the bonding portion is the same as a position in the third direction of a corner at an end on an end side on a side opposite to the gate-side end side in the longitudinal direction of another adjacent one of the bonding portions in the third direction in the semiconductor chip.

6. The semiconductor module according to claim 1, wherein the main electrode is connected to a plurality of the bonding portions, and the bonding portions are arranged to be line symmetric while a center line passing through a center in the third direction of the semiconductor chip is set as a reference.

7. The semiconductor module according to claim 1, wherein the bonding portion is overlapped with at least a part of one of the transistor portions and at least a part of an adjacent one of the diode portions in a top view.

8. The semiconductor module according to claim 1, wherein in at least one of the bonding portions, an area where the bonding portion is overlapped with the transistor portion in a top view is larger than an area where the bonding portion is overlapped with the diode portion in a top view.

9. The semiconductor module according to claim 1, wherein in at least one of the bonding portions, an area where the bonding portion is overlapped with the diode portion in a top view is larger than an area where the bonding portion is overlapped with the transistor portion in a top view.

10. The semiconductor module according to claim 1, further comprising:

a pad region in which the gate electrode pad is provided, wherein the main electrode has a first portion arranged to oppose the pad region in a top view, and two second portions arranged to sandwich the first portion in a top view without opposing the pad region in a top view, and a density of the bonding portions arranged in the first portion in a top view is lower than a density of the bonding portions arranged in the second portion in a top view.

11. The semiconductor module according to claim 1, wherein the bonding portions are arranged on a side of the end side that is a side opposite to the gate-side end side.

12. The semiconductor module according to claim 1, further comprising:

a plurality of gate wires each connected to the gate electrode pad of a respective one of the plurality of the semiconductor chips, wherein each of the gate wires has a gate bonding portion connected to the gate electrode pad of the respective one of the plurality of the semiconductor chips, the gate bonding portion has a gate longitudinal direction in a top view, and the gate longitudinal direction of the gate bonding portion has an angle in relation to the longitudinal direction of the bonding portion.

13. The semiconductor module according to claim 1, wherein the semiconductor chips includes semiconductor chips with different minimal widths of the transistor portions or different minimal widths of the diode portions, and an angle defined by the longitudinal direction of the bonding portion and the second direction varies based on the minimal width of the transistor portion or the minimal width of the diode portion.

14. The semiconductor module according to claim 12, wherein

Each of the plurality of wires extend from the main electrode of the corresponding one of the plurality of the semiconductor chips towards the main terminal side where the plurality of main terminals are arranged in a top view, and each of the gate wires extends towards a side opposite to the main terminal side from the gate electrode pad of the respective one of the plurality of the semiconductor chips.

15. The semiconductor module according to claim 1, wherein the third direction is a same direction as the first direction.

16. The semiconductor module according to claim 1, wherein the gate-side end side is arranged facing a side opposite to the main terminal side where the plurality of main terminals are arranged in a top view.

17. The semiconductor module according to claim 1, wherein an angle defined by the longitudinal direction of the bonding portion and the second direction is the same between all the semiconductor chips arranged in the main circuit portion.

18. The semiconductor module according to claim 1, wherein each of the plurality of wires has a neck portion connected to the bonding portion thereof, the neck portion has a neck portion longitudinal direction in a top view, and the longitudinal direction of the bonding portion has an angle in relation to the neck portion longitudinal direction of the neck portion connected to the bonding portion.

19. The semiconductor module according to claim 2, wherein an angle defined by the longitudinal direction of the bonding portion and the second direction is the same in each of the semiconductor chips.

20. The semiconductor module according to claim 2, wherein, in each of the plurality of the semiconductor chips, the main electrode is connected to a plurality of the bonding portions, and a position in the third direction of at least a part of the bonding portion is the same as a position in the third direction of at least a part of another adjacent one of the bonding portions in the third direction.

21. The semiconductor module according to claim 1, wherein each of the bonding portions overlaps the one of the transistor portions and the one of the diode portions in a top view, the one of the transistor portions and the one of the diode portions being adjacent to each other.

22. The semiconductor module according to claim 1, wherein each of the bonding portions overlaps a boundary between the one of the transistor portions and the one of the diode portions.

\*   \*   \*   \*   \*